(12) United States Patent
Yagi et al.

(10) Patent No.: US 6,649,033 B2
(45) Date of Patent: Nov. 18, 2003

(54) METHOD FOR PRODUCING ELECTRODE FOR LITHIUM SECONDARY BATTERY

(75) Inventors: Hiromasa Yagi, Nishinomiya (JP); Hisaki Tarui, Shijyonawate (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/106,205

(22) Filed: Mar. 27, 2002

(65) Prior Publication Data

US 2003/0038024 A1 Feb. 27, 2003

(30) Foreign Application Priority Data

Mar. 28, 2001  (JP) ........................................ 2001-093065

(51) Int. Cl.[7] ............................ C23C 14/34; B05D 5/12; B05D 1/00
(52) U.S. Cl. ............................. 204/192.23; 204/192.12; 427/209; 427/255.5; 427/255.7; 427/402; 427/115; 427/123; 427/124
(58) Field of Search ................ 204/192.12, 192.23, 204/298.24; 427/209, 255.5, 255.7, 402, 115, 123, 124

(56) References Cited

FOREIGN PATENT DOCUMENTS

| JP | 2001-185127 | * 7/2001 | ............ H01M/4/04 |
| JP | 2001-210319 | * 8/2001 | ............ H01M/4/04 |

OTHER PUBLICATIONS

English translation for JP 6–224674.*
JP 6–21620 Abstract.
JP 6–160881 Abstract.
JP 6–224674 Abstract.
JP 8–144048 Abstract.
JP 8–306028 Abstract.
JP 9–31629 Abstract.

* cited by examiner

Primary Examiner—Steven H. VerSteeg
(74) Attorney, Agent, or Firm—Kubovcik & Kubovcik

(57) ABSTRACT

The method for producing an electrode for a lithium secondary battery, having an active material in the form of a thin film composed of an interface layer formed on a current collector and an active material layer formed on the interface layer. The method comprises the steps of: depositing the interface layer on the current collector by sputtering; and depositing the active material layer on the interface layer by vapor evaporation.

10 Claims, 3 Drawing Sheets

METHOD FOR PRODUCING ELECTRODE FOR LITHIUM SECONDARY BATTERY

BACKGROUND OF THE INVENTION

1. Field of the Invention

The present invention relates to a method for producing an electrode for a lithium secondary battery.

2. Related Art

In recent years, research and development of lithium secondary batteries have been actively made. The battery performance of lithium secondary batteries, such as charge-discharge voltages, charge-discharge cycle life characteristics or storage characteristics, depends largely on the electrodes used. Therefore, improvement of active materials used for the electrodes has been attempted to enhance the battery performance.

A battery with high energy densities both per weight and per volume can be obtained by using lithium metal as a negative active material. This battery however has a problem that the lithium deposited on charge grows into dendrite, causing an internal short-circuiting.

To solve the above problem, there is reported a lithium secondary battery using any of aluminum, silicon, tin and the like, which are electrochemically alloyed with lithium during charging, as an electrode (Solid State Ionics, 113–115, p. 57 (1998)). Among the above metals, silicon, having a large theoretical capacity, is particularly promising as a battery negative electrode capable of providing a high capacity. Various secondary batteries using silicon as the negative electrode have been proposed (Japanese Patent Laid-Open No. 10-255768). However, this type of alloy negative electrode fails to provide sufficient cycle characteristics because the alloy as the electrode active material itself is pulverized during charging and discharging, resulting in reducing the current-collecting characteristics.

There have been proposed an electrode for lithium secondary batteries using silicon and the like as an electrode active material that exhibit a good charge-discharge cycle characteristics (International Patent Laid-Open WO01/31720A1 etc.), in which a microcrystalline or amorphous thin film is formed on a current collector by a thin-film forming method such as a CVD or sputtering method.

In the electrodes for lithium secondary batteries as described above, it is known that a component of the current collector diffuses into the thin film of active material, and that this serves to maintain adhesion between the current collector and the thin film of active material and thus improve the charge-discharge cycle characteristics. Therefore, in order to obtain excellent charge-discharge cycle characteristics, the interface between the current collector and the thin film of active material is preferably formed under control under optimal conditions. However, the thin film formed on the current collector must have some degree of thickness to be used as an active material. If the thin film of active material is formed under optimal thin-film forming conditions as described above, a long time is required for formation of the thin film, and thus high productivity is not obtained. As another problem, the current collector becomes hardened if it is exposed to high temperature for a long time during the thin film formation. This causes difficulty of changing the shape of a current collector in battery production.

SUMMARY OF THE INVENTION

An object of the present invention is to provide a method for producing an electrode for a lithium secondary battery, capable of depositing a thin film of active material on a current collector at a high film formation rate without deteriorating the mechanical properties of the current collector.

The present invention is directed to a method for producing an electrode for a lithium secondary battery, the electrode having an active material in the form of a thin film composed of an interface layer formed on a current collector and an active material layer formed on the interface layer. The method includes the steps of: depositing the interface layer on the current collector by sputtering; and depositing the active material layer on the interface layer by vapor evaporation.

Sputtering is a method for depositing a thin film by sputtering an active species generated from plasma against a current collector as a substrate. Therefore, the resultant thin film can provide a good interface with the current collector, and thus the adhesion of the thin film to the current collector is improved. Vapor evaporation is a method enabling deposition of a thin film at a film formation rate higher than that of the sputtering. According to the present invention, an interface layer is formed by sputtering, and then an active material layer is formed by vapor evaporation. Therefore, while the interface having good adhesion with the current collector can be formed, the active material thin film can be formed at a high film formation rate. In this way, it is possible to efficiently produce an electrode for a lithium secondary battery having a high charge-discharge capacity and excellent charge-discharge cycle characteristics.

The vapor evaporation method employed in the present invention is not specifically limited as long as it has a film formation rate higher than the sputtering. Vacuum vapor evaporation such as electron beam vapor evaporation and other vapor evaporation methods may be employed.

The material used as the active material in the present invention is not specifically limited as long as it can store and release lithium. However, a material storing lithium by being alloyed with lithium is preferred. Examples of such a material are silicon, germanium, tin, lead, zinc, magnesium, sodium, aluminum, potassium and indium. Among them, silicon is particularly preferred due to its high theoretical capacity. As silicon, amorphous or microcrystalline silicon is preferred.

In the case of forming the thin film of active material on both surfaces of the current collector, the interface layer and the active material layer are preferably formed on both surface of the current collector.

According to the present invention, the thickness of the interface layer is preferably 1 $\mu$m or less. If the thickness of the interface layer is larger, the thickness of the active material layer, which can be formed at a high film formation rate, is relatively smaller. This decreases the film formation rate as a whole, and thus may result in failure of attaining the object of the present invention of obtaining a high film formation rate. Also, the thickness of the interface layer is preferably 0.01 $\mu$m or more. In view of the above, the thickness of the interface layer is preferably in the range of 0.01 to 1 $\mu$m.

According to the present invention, both the sputtering for forming the interface layer and the vapor evaporation for forming the active material layer are performed under an evacuated atmosphere. Therefore, the formation of the interface layer and the formation of the active material layer are preferably performed successively in an evacuated atmosphere. By performing the successive formation without exposure to the air atmosphere, introduction of impurities into the layers is prevented. Thus, the interface layer and the active material layer are preferably formed within a same thin-film forming apparatus. Preferably, in such a case, the current collector is moved to respective positions for the formations of the interface layer and the active material layer.

In the case of forming the thin film of active material on both surfaces of the current collector according to the present invention, the formation of the interface layer and the active material layer on one surface of the current collector and the formation of the interface layer and the active material layer on the other surface of the current collector are preferably performed successively under an evacuated atmosphere.

The present invention is directed to a method for producing an electrode for a lithium secondary battery, which is applicable to both a negative electrode and a positive electrode. When the material such as silicon described above is used, the electrode is generally used as a negative electrode.

The current collector used according to the present invention is preferably made of a metal incapable of being alloyed with lithium. Examples of such a material are copper, copper alloy, nickel and stainless steel. The current collector may also be composed of a stack of two or more types of these materials.

According to the present invention, the interface layer and the active material layer are generally made of the same type of material, but may be made of different materials.

DESCRIPTION OF THE PREFERRED EMBODIMENTS

Hereinafter, the present invention will be described in more detail by way of examples. Note that the present invention is not restricted to the examples to follow, but any appropriate modification is possible as long as the scope of the invention is not changed.

(Experiment 1)
[Production of Negative Electrode]

A rolled copper foil (thickness: 26 μm) surface-roughened by depositing copper on the surface by electrolysis was used as a current collector. A silicon thin film was formed on the current collector with a thin-film forming apparatus shown in FIG. 1.

Figure 1:
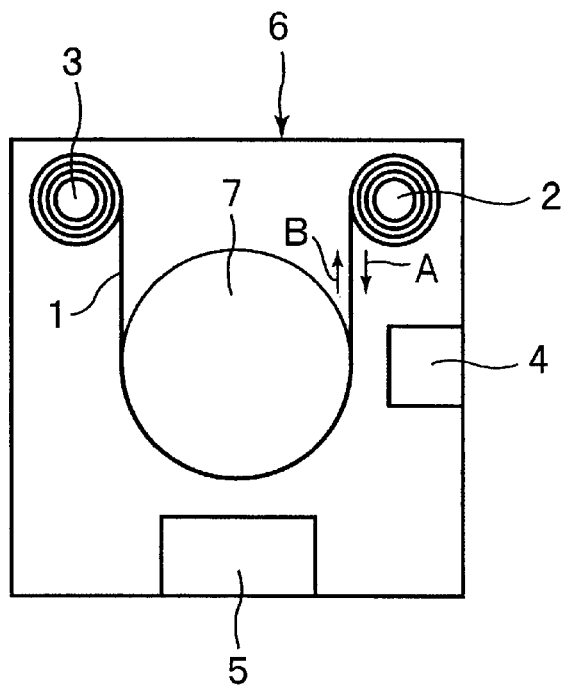
FIG. 1 is a schematic cross-sectional view of a thin-film forming apparatus used in examples according to the present invention.

Referring to FIG. 1, the thin-film forming apparatus 6 includes a sputtering source 4 and a vapor evaporation source 5. A current collector 1 is wound around rollers 2 and 3, traveling from the roller 2 to the roller 3, or from the roller 3 to the roller 2, along the outer circumference of a support roller 7 located between the rollers 2 and 3.

A thin film is formed by sputtering on an area of the current collector 1 facing the sputtering source 4, while a thin film is formed by vapor evaporation on an area of the current collector 1 facing the vapor evaporation source 5.

The sputtering source 4 includes a target made of 99.999% single crystal silicon and a high-frequency power supply connected to the target. The vapor evaporation source 5 is a source for electron beam vapor evaporation, using 99.999% small-particle silicon as the vapor evaporation material.

First, the current collector 1, wound up around the roller 2, was moved in the direction of arrow A while being wound around the roller 3. During the movement, a silicon thin film was deposited on a predetermined area of the current collector 1 with the sputtering source 4, to form an interface layer. The conditions of sputtering at this time are shown in Table 1. Argon (Ar) was used as ambient gas.

TABLE 1

| Ar Flow | 50 sccm |
|---|---|
| Sputtering Ambient Pressure | 0.1 Pa |
| Sputtering Electric Power | 1 kW |

Once the current collector 1 with the interface layer formed thereon was wound up around the roller 3, the current collector 1 was moved in the opposite direction, that is, the direction of arrow B, while being wound around the roller 2. During the movement, a silicon thin film was deposited on the interface layer of the current collector 1 with the vapor evaporation source 5, to form an active material layer. The conditions of vapor evaporation at this time are shown in Table 2.

TABLE 2

| Electron Beam Acceleration Voltage | 5 kV |
|---|---|
| Electron Beam Current | 100 mA |
| Evaporation Ambient Pressure | $<10^{-4}$ Pa |

In Examples 1 to 4, an interface layer and an active material layer each having a thickness shown in Table 3 were formed. In Comparative Example 1, an active material layer was formed directly on the current collector by sputtering to a thickness shown in Table 3 without formation of an interface layer. In Comparative Example 2, an active material layer was formed directly on the current collector by vapor evaporation to a thickness shown in Table 3 without formation of an interface layer.

The silicon thin films formed in Examples 1 to 4 and Comparative Examples 1 and 2 were subjected to Raman spectroscopic analysis to identify the crystallinity. As a result, while a peak around 480 $cm^{-1}$ was substantially recognized, no peak around 520 $cm^{-1}$ was substantially recognized, for all of the silicon thin films. From these results, it was confirmed that all of the silicon thin films were amorphous silicon thin films.

The silicon thin film was selectively formed on a 2.5 cm×2.5 cm area of the current collector by use of a mask. As described above, a portion of the resultant current collector including the 2.5 cm×2.5 cm silicon thin film was cut off, and a negative tab was attached to an area of the current collector on which no silicon thin film was formed, to thereby complete a negative electrode.

[Production of Positive Electrode]

A mixed slurry for positive electrode was prepared by mixing 90 parts by weight of $LiCoO_2$ powder and 5 parts by weight of artificial graphite powder as a conductor in 5 wt. % N-methylpyrrolidone aqueous solution containing 5 parts by weight of polytetrafluoroethylene as a binder. The slurry was applied to a 2 cm×2 cm area of an aluminum foil (thickness: 18 μm) as a positive current collector, and then dried, to form a positive active material layer. A positive tab was attached to an area of the aluminum foil sheet on which no positive active material layer was formed, to thereby complete a positive electrode.

[Preparation of Electrolyte]

One mol/liter of $LiPF_6$ was dissolved in mixed solvent of ethylene carbonate and dimethyl carbonate at a 1:1 ratio by volume, to prepare an electrolyte for use in the following manufacture of a battery.

[Manufacture of Battery]

Figure 4:
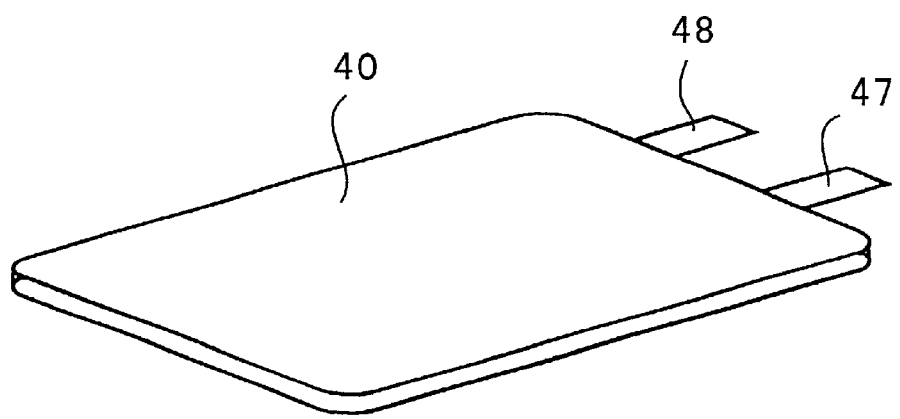
FIG. 4 is a perspective view of a lithium secondary battery manufactured in examples according to the present invention.
Figure 5:
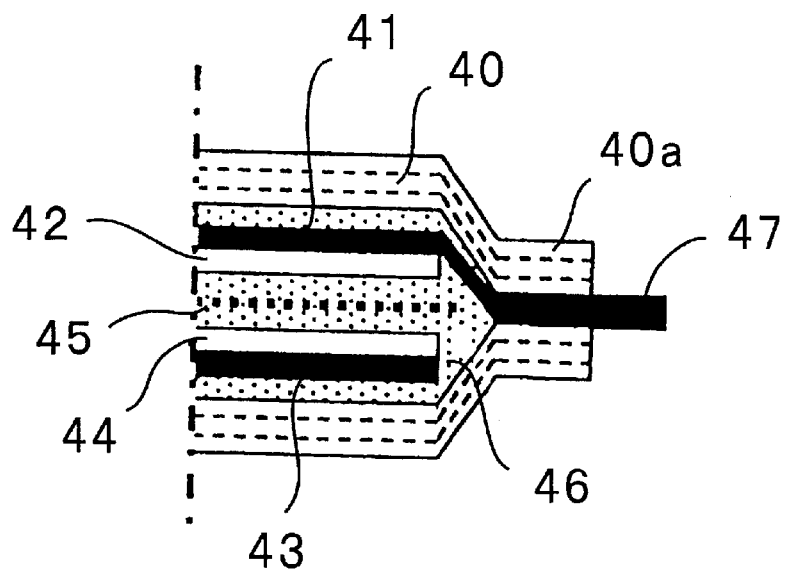
FIG. 5 is a cross-sectional view of the lithium secondary battery manufactured in examples according to the present invention.

FIG. 4 is a perspective view of a lithium secondary battery. FIG. 5 is a schematic cross-sectional view of the lithium secondary battery. As shown in FIG. 5, a positive electrode and a negative electrode are placed in a sheath 40 made of an aluminum laminate film. A silicon thin film 42 as a negative active material is formed on a negative current collector 41, and a positive active material layer 44 is formed on a positive current collector 43. The silicon thin film 42 and the positive active material layer 44 face each other via a separator 45 therebetween. An electrolyte 46 is injected inside the sheath 40. An end of the sheath 40 is sealed by welding, forming a sealed end 40a. A negative tab 47 attached to the negative current collector 41 extends externally through the sealed end 40a. Although not shown in FIG. 5, a positive tab 48 attached to the positive electrode current collector 43 also extends externally through the sealed end 40a.

[Charge-Discharge Cycle Test]

A charge-discharge cycle test was performed for each of the lithium secondary batteries manufactured in the manner described above. As the charge-discharge conditions, the battery was charged at a charge current of 9 mA to the charge end capacity of 9 mAh, and then discharged at a discharge current of 9 mA to the discharge end voltage of 2.75 V. This one cycle of charge-discharge was repeated, and the discharge capacities and the charge-discharge efficiencies at the first, the fifth and the twentieth cycle were measured. The measurement results are shown in Table 3.

TABLE 3

|  | Ex. 1 | Comp. Ex. 1 | Comp. Ex. 2 | Ex.2 | Ex. 3 | Ex. 4 |
|---|---|---|---|---|---|---|
| Thin Film Formation Conditions |  |  |  |  |  |  |
| Interface Layer |  |  |  |  |  |  |
| Method | Sputtering |  |  | Sputtering | Sputtering | Sputtering |
| Film Thickness (μm) | 0.5 |  |  | 1.0 | 1.5 | 2.0 |
| Time (minute) | 30 |  |  | 60 | 90 | 120 |
| Active material Layer |  |  |  |  |  |  |
| Method | Vapor Evaporation | Sputtering | Vapor Evaporation | Vapor Evaporation | Vapor Evaporation | Vapor Evaporation |
| Film Thickness (μm) | 5.5 | 6.0 | 6.0 | 5.0 | 4.5 | 4.0 |
| Time (minute) | 27.5 | 360 | 30 | 25 | 22.5 | 20 |
| Total Time | 57.5 | 360 | 30 | 85 | 112.5 | 140 |
| Hardening of Current Collector | Not Observed | Not Observed | Not Observed | Not Observed | Slightly Observed | Slightly Observed |
| 1st cycle |  |  |  |  |  |  |
| Discharge Capacity (mAh/g) | 2124 | 2085 | 516 | 2145 | 2058 | 2038 |
| Charge-Discharge Efficiency (%) | 85 | 92 | 48 | 84 | 92 | 91 |
| 5th cycle |  |  |  |  |  |  |
| Discharge Capacity (mAh/g) | 2025 | 2102 | 150 | 2120 | 2086 | 2095 |
| Charge-Discharge Efficiency (%) | 100 | 99 | 72 | 99 | 99 | 99 |
| 20th cycle |  |  |  |  |  |  |
| Discharge Capacity (mAh/g) | 2014 | 2005 |  | 2051 | 1998 | 2013 |
| Charge-Discharge Efficiency (%) | 99 | 99 |  | 99 | 99 | 99 |

As is apparent from a comparison between Example 1 and Comparative Example 1, when the active material thin film is formed only by sputtering, the current collector is hardened because it is exposed to high temperature for a long time. If the current collector is hardened, there arise problems such as that the shape of the electrode cannot be changed into a predetermined shape during battery manufacture. As is apparent from a comparison between Example 1 and Comparative Example 2, when the thin film of active material is formed only by vapor evaporation, good charge-discharge cycle characteristics are not obtained. This is because the vapor evaporation fails to provide good adhesion between the current collector and the thin film of active material.

In Examples 3 and 4, slight hardening was observed in the current collector. Therefore, it is found that the thickness of the interface layer is preferably 1.0 μm or less.

(Experiment 2)

[Production of Negative Electrode]

Figure 2:
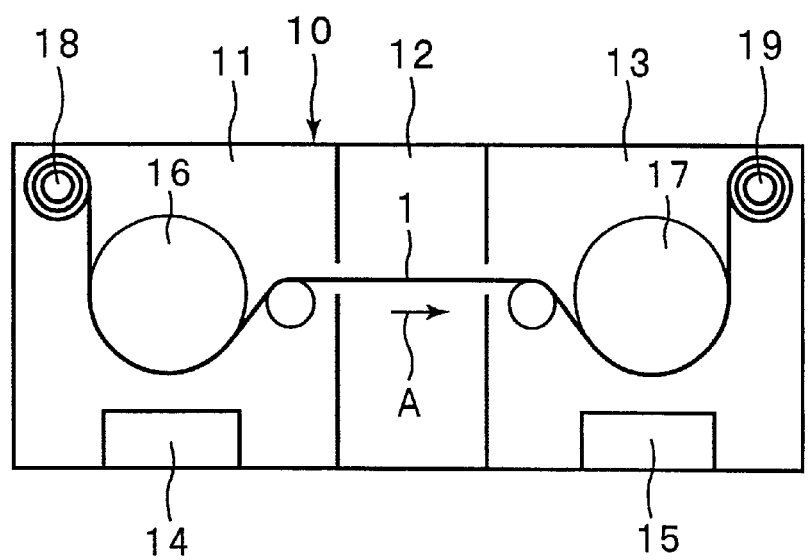
FIG. 2 is a schematic cross-sectional view of a thin-film forming apparatus used in examples according to the present invention.

An interface layer and an active material layer were formed on a current collector in the same manner described in Experiment 1, except that a thin-film forming apparatus shown in FIG. 2 was used.

The thin-film forming apparatus 10 shown in FIG. 2 is partitioned into three chambers: a sputtering chamber 11, a preparatory chamber 12 and a vapor evaporation chamber 13. Not only the sputtering chamber 11 and the vapor evaporation chamber 13, but also the preparatory chamber 12 are evacuated, so that the amount of flow of Ar gas for sputtering into the vapor evaporation chamber 13 can be reduced. A sputtering source 14 is placed in the sputtering chamber 11, and a vapor evaporation source 15 is placed in the vapor evaporation chamber 13. The sputtering source 14 and the vapor evaporation source 15 are the same as the sputtering source 4 and the vapor evaporation source 5 in the apparatus shown in FIG. 1.

The current collector 1, wound up around a roller 18, is moved from the sputtering chamber 11 to the vapor evaporation chamber 13 through the preparatory chamber 12 while being wound around a roller 19. In the sputtering chamber 11, a silicon thin film is deposited on an area of the current collector 1 on a support roller 16 facing the sputtering source 14, to form an interface layer. The current collector 1 is then moved in the direction of arrow A, and in the vapor evaporation chamber 13, a silicon thin film is deposited on the interface layer on the current collector 1 on a support roller 17 facing the vapor evaporation source 15, to form an active material layer.

The sputtering conditions and the vapor evaporation conditions were the same as those described in Experiment 1.

In Example 5, an interface layer and an active material layer each having a thickness shown in Table 4 were formed. In Comparative Example 3, an active material layer was formed on the current collector by sputtering to a thickness shown in Table 4 without formation of an interface layer. In Comparative Example 4, an active material layer was formed on the current collector by vapor evaporation to a thickness shown in Table 4 without formation of an interface layer. The interface layer and the active material layer were formed in an area of 2.5 cm×2.5 cm using a mask.

[Manufacture of Battery]

A positive electrode and an electrolyte were produced in the same manner described in Experiment 1, and lithium secondary batteries were manufactured using the negative electrodes in Example 5 and Comparative Examples 3 and 4 in the same manner described in Experiment 1.

[Charge-Discharge Cycle Test]

Charge-discharge cycle tests were performed for the thus-manufactured batteries in the same manner described in Experiment 1. The test results are as shown in Table 4.

TABLE 4

|  | Ex. 5 | Comp. Ex. 3 | Comp. Ex. 4 |
|---|---|---|---|
| Thin Film Formation Conditions Interface Layer |  |  |  |
| Method | Sputtering |  |  |
| Film Thickness (μm) | 0.46 |  |  |
| Time (minute) | 27.7 |  |  |
| Active Material Layer |  |  |  |
| Method | Vapor Evaporation | Sputtering | Vapor Evaporation |
| Film Thickness (μm) | 5.54 | 6.0 | 6.0 |
| Time (minute) | 27.7 | 360 | 30 |
| Total Time | 55.4 | 360 | 30 |
| Hardening of Current Collector | Not Observed | Observed | Observed |
| 1st cycle |  |  |  |
| Discharge Capacity (mAh/g) | 2038 | 2075 | 554 |
| Charge-Discharge Efficiency (%) | 88 | 91 | 53 |
| 5th cycle |  |  |  |
| Discharge Capacity (mAh/g) | 2008 | 2015 | 213 |
| Charge-Discharge Efficiency (%) | 100 | 99 | 76 |
| 20th cycle |  |  |  |
| Discharge Capacity (mAh/g) | 2014 | 2005 |  |
| Charge-Discharge Efficiency (%) | 99 | 99 |  |

As is apparent from Table 4, by forming an interface layer by sputtering and then an active material layer by vapor evaporation according to the present invention, an electrode having excellent charge-discharge cycle characteristics can be produced while the mechanical properties of the current collector are maintained.

(Experiment 3)

Figure 3:
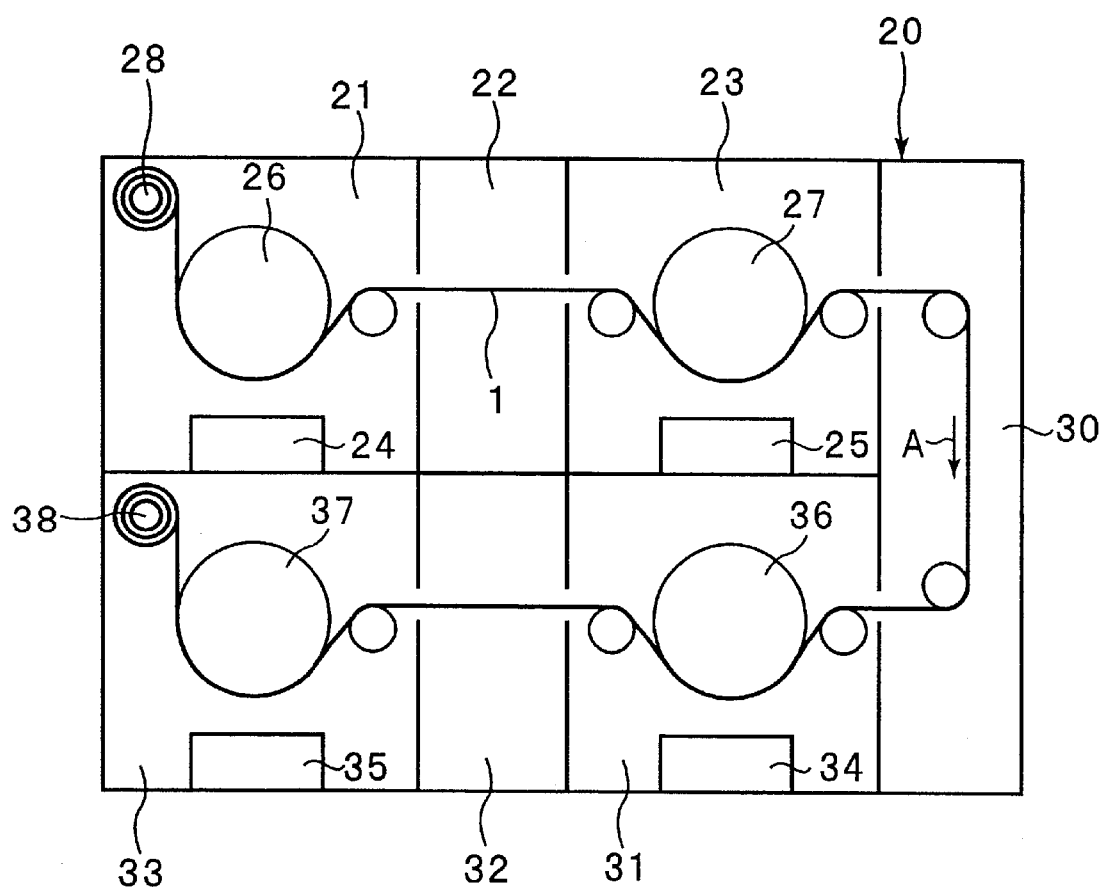
FIG. 3 is a schematic cross-sectional view of a thin-film forming apparatus used in examples according to the present invention.

A silicon thin film was formed on a current collector in the same manner described in Experiment 1, except that a thin-film forming apparatus shown in FIG. 3 was used.

As shown in FIG. 3, the thin-film forming apparatus 20 includes a first sputtering chamber 21, a first preparatory chamber 22 and a first vapor evaporation chamber 23 each for formation of an interface layer and an active material layer on one surface of the current collector 1. The apparatus 20 also includes a second sputtering chamber 31, a second preparatory chamber 32 and a second vapor evaporation chamber 33 each for formation of an interface layer and an active material layer on the other surface of the current collector 1. A third preparatory chamber 30 is provided between the first vapor evaporation chamber 23 and the second sputtering chamber 31. Support rollers 26, 27, 36 and 37 are provided in the first sputtering chamber 21, the first vapor evaporation chamber 23, the second sputtering chamber 31, and the second vapor evaporation chamber 33, respectively.

A first sputtering source 24 is placed in the first sputtering chamber 21, and a second sputtering source 34 is placed in the second sputtering chamber 31. The first and second sputtering sources 24 and 34 are the same as the sputtering source 4 shown in FIG. 1. A first vapor evaporation source 25 is placed in the first vapor evaporation chamber 23, and a second vapor evaporation source 35 is placed in the second vapor evaporation chamber 33. The first and second vapor evaporation sources 25 and 35 are the same as the vapor evaporation source 5 shown in FIG. 1.

The current collector 1, wound up around a roller 28 in the first sputtering chamber 21, is moved through the first sputtering chamber 21, the first preparatory chamber 22, the first vapor evaporation chamber 23, the third preparatory chamber 30, the second sputtering chamber 31 and the second preparatory chamber 32 to be wound around a roller 38 in the second vapor evaporation chamber 33. In the first sputtering chamber 21, a silicon thin film is deposited on an area of one surface of the current collector 1 facing the first sputtering source 24 by sputtering, to form an interface layer. In the first vapor evaporation chamber 23, a silicon thin film is deposited on an area of the interface layer on the surface of the current collector 1 facing the first vapor evaporation source 25, to form an active material layer.

The current collector 1 then passes through the third preparatory chamber 30 to be supplied to the second sputtering chamber 31. In the second sputtering chamber 31, the surface of the current collector 1 opposite to the surface on which the interface layer and the active material layer have been formed is exposed on a support roller 36. A silicon thin film is then deposited on an area of the current collector facing the second sputtering source 34. That is, the interface layer is formed on the other surface of the current collector. The current collector 1 with the interface layer formed thereon passes through the second preparatory chamber 32 to be supplied to the second vapor evaporation chamber 33. In the second vapor evaporation chamber 33, a silicon thin film is deposited on an area of the interface layer on the current collector 1 facing the vapor evaporation source 35, to form an active material layer.

In the manner described above, the interface layer and the active material layer are formed on the predetermined areas of both surfaces of the current collector, and the resultant current collector is wound around the roller 38.

In Example 6, an interface layer and an active material layer each having a thickness shown in Table 5 were formed on both surfaces of the current collector. In Comparative Example 6, a silicon thin film was formed on both surfaces of the current collector only by sputtering. In Comparative Example 6, a silicon thin film was formed on both surfaces of the current collector only by vapor evaporation. The interface layer and the active material layer were formed in an area of 2.5 cm×2.5 cm using a mask.

Electrodes in Example 6 and Comparative Examples 5 and 6 were produced in the same manner described in Experiment 1

[Manufacture of Battery]

Lithium secondary batteries were manufactured using the electrodes in Example 6 and Comparative Examples 5 and 6 in the same manner described in Experiment 1.

[Charge-Discharge Cycle Test]

Charge-discharge cycle tests were performed for the thus-manufactured batteries in the same manner described in Experiment 1. The test results are as shown in Table 5.

TABLE 5

|  | Ex. 6 | Comp. Ex. 5 | Comp. Ex. 6 |
|---|---|---|---|
| Thin Film Formation Conditions (both-side continuous formation) Interface Layer | | | |
| Method | Sputtering | | |
| Film Thickness ($\mu$m) | 0.46 | | |
| Time (minute) | 27.7 × 2 | | |
| Active material Layer | | | |
| Method | Vapor Evaporation | Sputtering | Vapor Evaporation |
| Film Thickness ($\mu$m) | 5.54 | 6.0 | 6.0 |
| Time (minute) | 27.7 × 2 | 360 × 2 | 30 × 2 |
| Total Time | 55.4 × 2 | 360 × 2 | 30 × 2 |
| Hardening of Current Collector 1$^{st}$ cycle | Not Observed | Observed | Not Observed |
| Discharge Capacity (mAh/g) | 4015 | 4152 | 1107 |
| Charge-Discharge (mAh/g) 5$^{th}$ cycle | 87 | 91 | 55 |
| Discharge Capacity (mAh/g) | 3958 | 4013 | 451 |
| Charge-Discharge Efficiency (%) 20$^{th}$ cycle | 99 | 98 | 71 |
| Discharge Capacity (mAh/g) | 3877 | 3906 | |
| Charge-Discharge Efficiency (%) | 99 | 99 | |

As is apparent from the results in Table 5, in Example 6, by forming interface layers by sputtering and active material layers by vapor evaporation, on both surfaces of the current collector according to the present invention, an electrode excellent in charge-discharge cycle characteristics can be produced while the mechanical properties of the current collector are maintained.

Thus, according to the present invention, it is possible to deposit a thin film of active material on the current collector at a high film formation rate without deteriorating the mechanical properties of the current collector.

What is claimed is:

1. A method for producing an electrode for a lithium secondary battery, the electrode having an active material in the form of a thin film composed of an interface layer formed on a current collector and an active material layer formed on the interface layer, the method comprising the steps of:

depositing said interface layer on said current collector by sputtering; and depositing said active material layer on said interface layer by vapor evaporation.

2. The method for producing an electrode for a lithium secondary battery according to claim 1, wherein said interface layer and said active material layer are formed on both surfaces of said current collector.

3. The method for producing an electrode for a lithium secondary battery according to claim 2, wherein deposition of said interface layer and said active material layer on one surface of said current collector and deposition of said interface layer and said active material layer on the other surface of said current collector are performed successively while an evacuated atmosphere is sustained.

4. The method for producing an electrode for a lithium secondary battery according to claim 1, wherein the thickness of said interface layer is 1 μm or less.

5. The method for producing an electrode for a lithium secondary battery according to claim 1, wherein said interface layer and said active material layer are successively deposited in sequence while an evacuated atmosphere is sustained.

6. The method for producing an electrode for a lithium secondary battery according to claim 5, wherein said interface layer and said active material layer are deposited in sequence while said current collector is moved within a same apparatus.

7. The method for producing an electrode for a lithium secondary battery according to claim 1, wherein at least silicon is contained in said interface layer and said active material layer, respectively.

8. The method for producing an electrode for a lithium secondary battery according to claim 1, wherein the electrode for a lithium secondary battery is a negative electrode.

9. The method for producing an electrode for a lithium secondary battery according to claim 8, wherein said current collector is formed of one type, or a stack of two or more types, selected from the group consisting of copper, copper alloy, nickel and stainless steel.

10. The method for producing an electrode for a lithium secondary battery according to claim 1, wherein said thin film is made of amorphous silicon.

* * * * *